United States Patent
Sakiyama et al.

(10) Patent No.: US 8,823,053 B2
(45) Date of Patent: Sep. 2, 2014

(54) SEMICONDUCTOR DEVICE INCLUDING A PLURALITY OF FIRST FLAT PLATES CONTAINING A MATERIAL THAT ABSORBS AN ELECTROMAGNETIC WAVE AT A HIGH FREQUENCY

(71) Applicant: Kabushiki Kaisha Toshiba, Tokyo (JP)

(72) Inventors: Yoko Sakiyama, Kawasaki (JP); Kohei Morizuka, Himeji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,771

(22) Filed: Feb. 28, 2013

(65) Prior Publication Data

US 2014/0077260 A1    Mar. 20, 2014

(30) Foreign Application Priority Data

Sep. 20, 2012  (JP) ................................ 2012-206800

(51) Int. Cl.
  *H01L 29/66*   (2006.01)
  *H01L 29/739*  (2006.01)
  *H01L 27/12*   (2006.01)

(52) U.S. Cl.
  CPC ........ *H01L 29/7394* (2013.01); *H01L 27/1211* (2013.01)
  USPC ........... 257/140; 257/107; 257/133; 257/139; 257/659; 257/E27.016; 257/E27.022; 257/27.073; 327/564; 336/200; 361/118

(58) Field of Classification Search
  CPC ............ H01L 29/7394; H01L 27/1211; H01L 29/7395; H01L 29/749; H01L 29/1095
  USPC .......... 257/140, 107, 133, 139, 659, E27.016, 257/E27.022, E27.073; 327/564; 336/200; 361/118
  See application file for complete search history.

(56) References Cited

U.S. PATENT DOCUMENTS

| | | | |
|---|---|---|---|
| 5,536,972 A * | 7/1996 | Kato | 257/706 |
| 6,501,364 B1 * | 12/2002 | Hui et al. | 336/200 |
| 2004/0125529 A1* | 7/2004 | Arai et al. | 361/118 |
| 2011/0285459 A1* | 11/2011 | Uemura | 327/564 |

FOREIGN PATENT DOCUMENTS

| | | |
|---|---|---|
| JP | 07-273276 A | 10/1995 |
| JP | 2001-185679 A | 7/2001 |
| JP | 2005-311019 A | 11/2005 |
| JP | 2011-210771 A | 10/2011 |

* cited by examiner

*Primary Examiner* — Meiya Li
*Assistant Examiner* — Peter M Albrecht
(74) *Attorney, Agent, or Firm* — Holtz, Holtz Goodman & Chick

(57) ABSTRACT

The semiconductor device includes a plurality of first flat plates containing a material that absorbs an electromagnetic wave at a high frequency. Any of the first flat plates is disposed above the first connecting wire, and any other of the first flat plates is disposed above the second connecting wire.

11 Claims, 3 Drawing Sheets

US 8,823,053 B2

SEMICONDUCTOR DEVICE INCLUDING A PLURALITY OF FIRST FLAT PLATES CONTAINING A MATERIAL THAT ABSORBS AN ELECTROMAGNETIC WAVE AT A HIGH FREQUENCY

CROSS-REFERENCE TO RELATED APPLICATION

This application is based upon and claims the benefit of priority from the prior Japanese Patent Application No. 2012-206800, filed on Sep. 20, 2012, the entire contents of which are incorporated herein by reference.

BACKGROUND

1. Field

Embodiments described herein relate generally to a semiconductor device.

2. Background Art

Some conventional semiconductor devices include a plurality of semiconductor elements connected in parallel with each other. A semiconductor device of this conventional type has a ferrite core inserted in a wire between a branch of a module gate wire and a gate pad of each insulated gate bipolar transistor ("IGBT") element.

DETAILED DESCRIPTION

A semiconductor device according to an embodiment includes an insulating substrate. The semiconductor device includes a first electrode disposed on the insulating substrate. The semiconductor device includes a second electrode disposed on the insulating substrate. The semiconductor device includes a third electrode disposed on the insulating substrate. The semiconductor device includes a first switch element disposed on the first electrode and electrically connected to the first electrode at a first terminal thereof. The semiconductor device includes a first connecting wire that electrically connects a second terminal of the first switch element to the third electrode. The semiconductor device includes a second switch element disposed on the second electrode and electrically connected to the second electrode at a first terminal thereof. The semiconductor device includes a second connecting wire that electrically connects a second terminal of the second switch element to the third electrode so that the second switch element is connected in parallel with the first switch element. The semiconductor device includes a first gate wire electrically connected to a gate of the first switch element. The semiconductor device includes a second gate wire electrically connected to a gate of the second switch element. The semiconductor device includes a third connecting wire electrically connected to the first electrode and the second electrode. The semiconductor device includes a fourth connecting wire electrically connected to the third electrode. The semiconductor device includes a plurality of first flat plates containing a material that absorbs an electromagnetic wave at a high frequency.

Any of the first flat plates is disposed above the first connecting wire, and any other of the first flat plates is disposed above the second connecting wire.

In the following, an embodiment will be described with reference to the drawings. Although a case where an IGBT element is used as a switch element will be described in the following embodiment, a MOS transistor or other voltage-controlled switch elements may also be used.

First Embodiment

Figure 1:
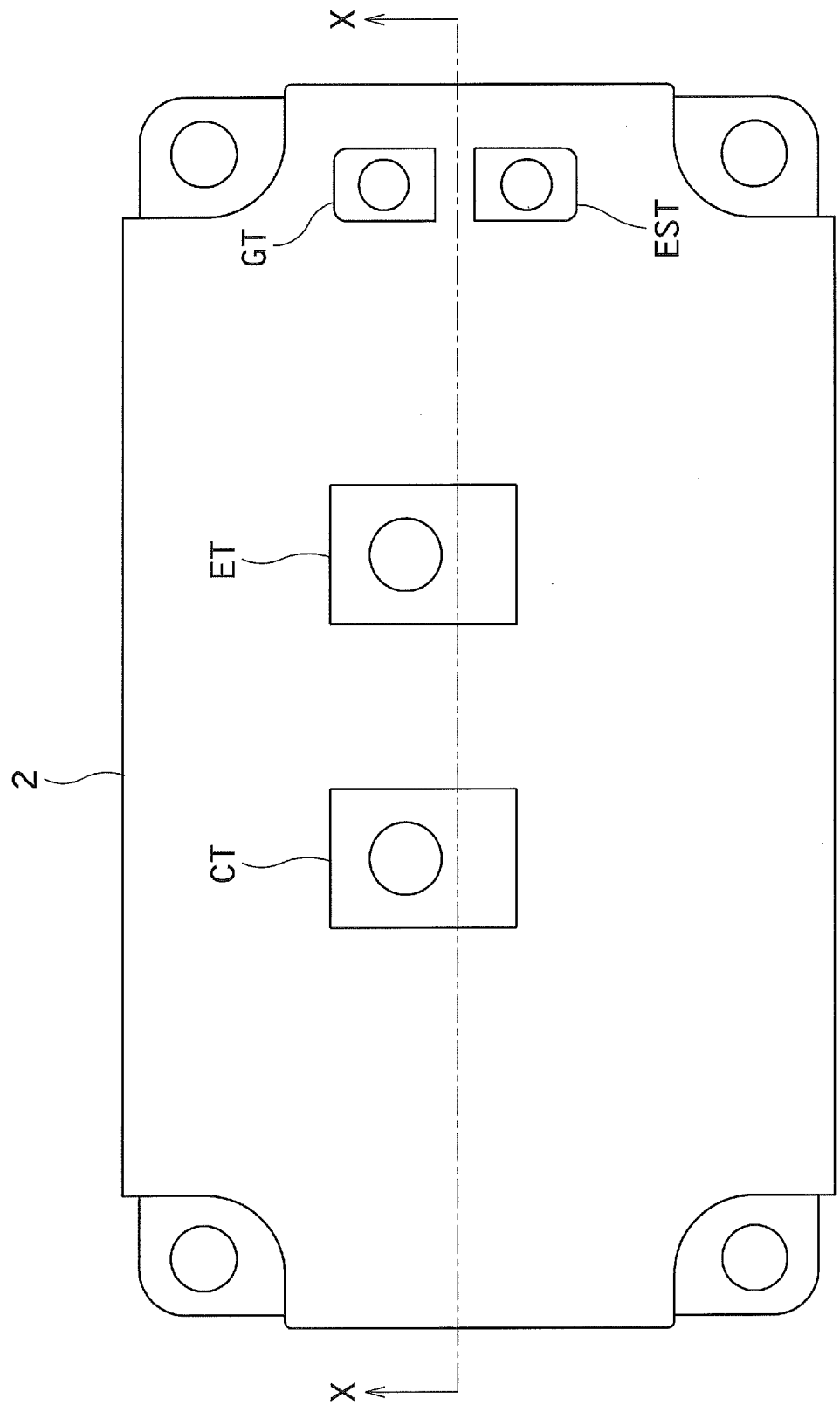
FIG. 1 is a plan view showing an example of a configuration of a semiconductor device 100 according to a first embodiment.
Figure 2:
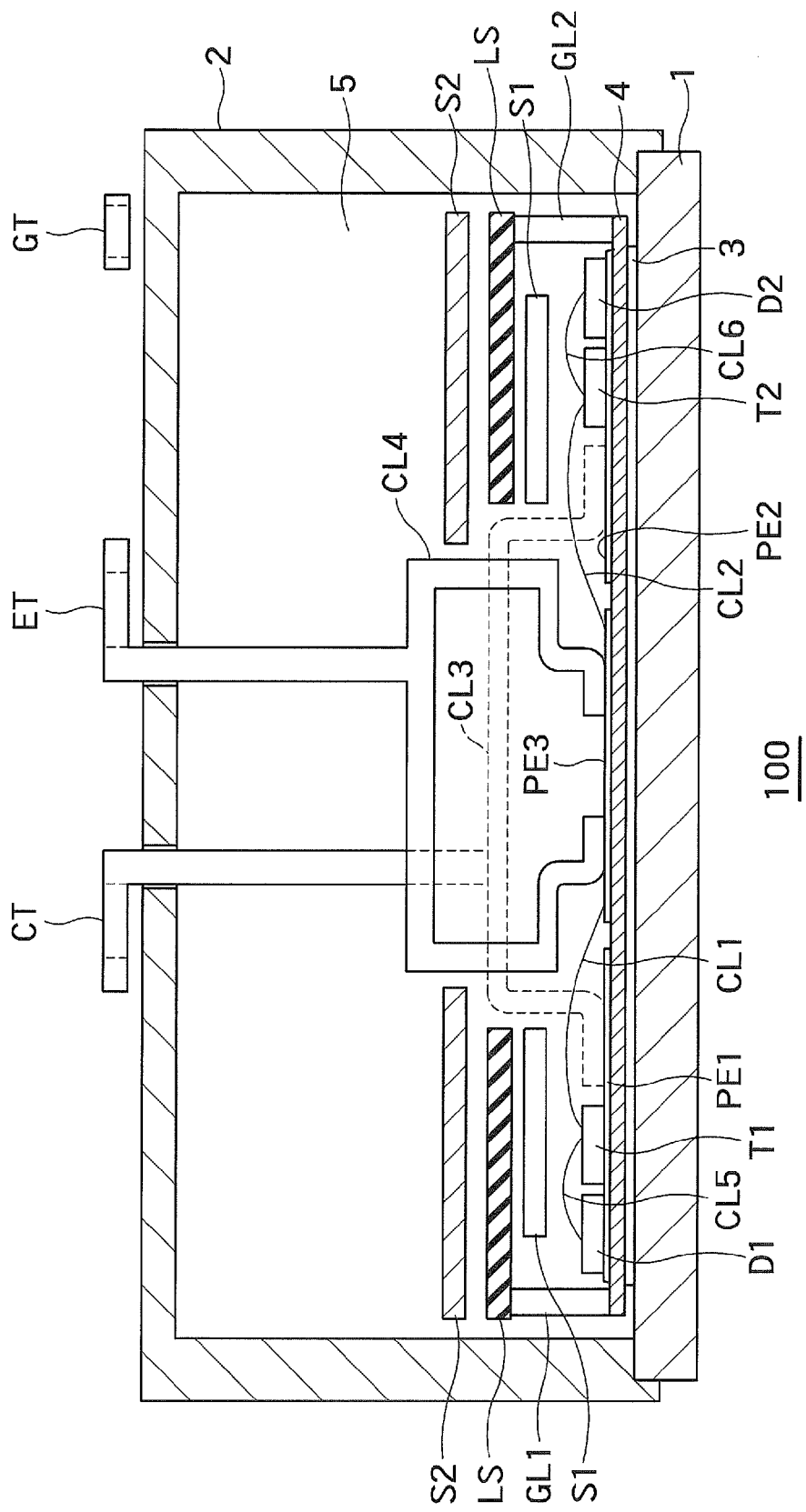
FIG. 2 is a cross-sectional view showing an example of a cross section of the semiconductor device 100 taken along the line X-X in FIG. 1.
Figure 3:
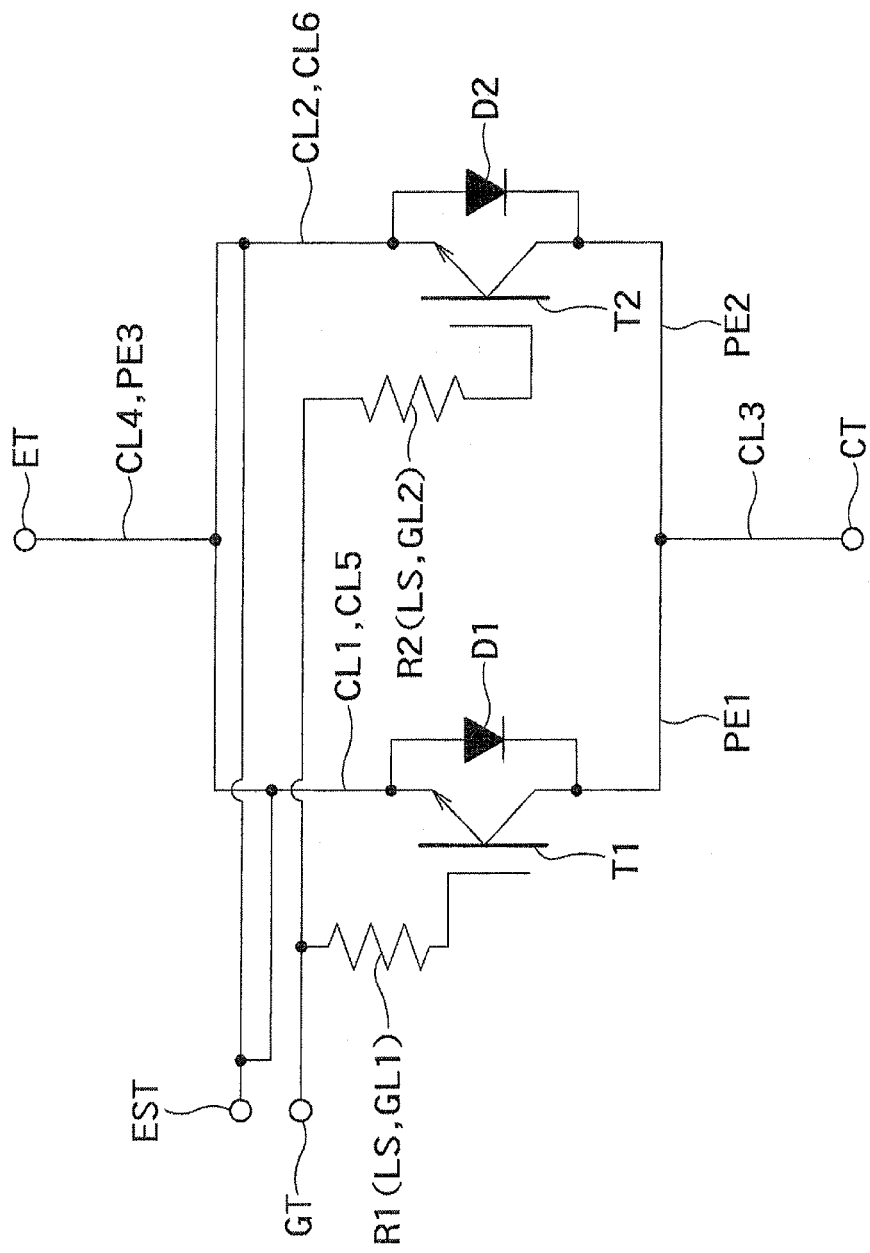
FIG. 3 is a circuit diagram showing an example of a circuit configuration of the semiconductor device 100 shown in FIG. 1.

FIG. 1 is a plan view showing an example of a configuration of a semiconductor device 100 according to a first embodiment. FIG. 2 is a cross-sectional view showing an example of a cross section of the semiconductor device 100 taken along the line X-X in FIG. 1. FIG. 3 is a circuit diagram showing an example of a circuit configuration of the semiconductor device 100 shown in FIG. 1.

As shown in FIGS. 1 to 3, the semiconductor device 100 includes a heat radiating plate 1, a housing 2, a conductive film 3, an insulating substrate 4, a resin seal 5, a first electrode PE1, a second electrode PE2, a third electrode PE3, a first IGBT element (a first switch element) T1, a second IGBT element (a second switch element) T2, a first connecting wire CL1, a second connecting wire CL2, a third connecting wire CL3, a fourth connecting wire CL4, a fifth connecting wire CL5, a sixth connecting wire CL6, a first gate wire GL1, a second gate wire GL2, a first diode D1, a second diode D2, a plurality of first flat plates S1, a plurality of second flat plates S2, a wiring substrate "LS", a first external terminal (a gate terminal) "GT", a second external terminal (a collector terminal) "CT", a third external terminal (an emitter terminal) "ET" and a fourth external terminal (an emitter sense terminal) "EST".

The housing 2 is made of a resin material and disposed on the heat radiating plate 1 so as to surround the resin seal 5.

The resin seal 5 is configured to seal, on the heat radiating plate 1, at least the insulating substrate 4, the first to third electrodes PE1 to PE3, the first and second IGBT elements T1 and T2, the first and second diodes D1 and D2, the first and second gate wires GL1 and GL2, the wiring substrate "LS", the first to sixth connecting wires CL1 to CL6 and the first flat plates S1.

The first external terminal "GT" is disposed to be exposed from the resin seal 5 (FIGS. 1 and 2). The first external terminal "GT" is electrically connected to the first gate wire GL1 and the second gate wire GL2 (the gates of the first and second IGBT elements T1 and T2) via the wiring substrate "LS" (FIGS. 2 and 3).

The second external terminal "CT" is disposed to be exposed from the resin seal 5 (FIGS. 1 and 2). The second external terminal "CT" is electrically connected to the third connecting wire CL3. That is, the second external terminal "CT" is electrically connected to the collector of the first IGBT element T1 and the collector of the second IGBT element T2 (FIGS. 2 and 3).

The third external terminal "ET" is disposed to be exposed from the resin seal 5 (FIGS. 1 and 2). The third external terminal "ET" is electrically connected to the fourth connecting wire CL4. That is, the third external terminal "ET" is electrically connected to the emitter of the first IGBT element T1 and the emitter of the second IGBT element T2 (FIGS. 2 and 3).

The fourth external terminal "EST" is disposed to be exposed from the resin seal 5 and is electrically connected to the emitters of the first and second IGBT elements T1 and T2 (FIG. 1).

As shown in FIGS. 1 and 2, the first to third external terminals "GT", "CT" and "ET" are disposed outside of the housing 2.

The heat radiating plate 1 is configured to radiate heat generated in the semiconductor device 100 to the outside. The heat radiating plate 1 is made of a material having a high thermal conductivity containing aluminum, for example.

The conductive film 3 is formed on the heat radiating plate 1 by applying a solder containing copper, for example.

The insulating substrate 4 is disposed above the heat radiating plate 1 with the conductive film 3 interposed therebetween. The insulating substrate 4 is made of aluminum oxide, for example.

The first electrode PE1 has the shape of a flat plate and is disposed on the insulating substrate 4.

The second electrode PE2 has the shape of a flat plate and is disposed on the insulating substrate 4.

The third electrode PE3 has the shape of a flat plate and is disposed on the insulating substrate 4.

The first IGBT element T1 is disposed on the first electrode PE1. In the example shown in FIG. 2, the first IGBT element T1 is electrically connected to the first electrode PE1 at the collector thereof. However, the first IGBT element T1 may be electrically connected to the first electrode PE1 at the emitter thereof.

In short, the first IGBT element T1 is disposed on the first electrode PE1 and is electrically connected to the first electrode PE1 at one of the emitter and the collector (one end) thereof.

In the example shown in FIG. 2, the first connecting wire CL1 is configured to electrically connect the emitter of the first IGBT element T1 to the third electrode PE3. However, the first connecting wire CL1 may be configured to electrically connect the collector of the first IGBT element T1 to the third electrode PE3.

In short, the first connecting wire CL1 is configured to electrically connect the remaining one (the other end) of the emitter and the collector of the first IGBT element T1 to the third electrode PE3.

The second IGBT element T2 is disposed on the second electrode PE2. In the example shown in FIG. 2, the second IGBT element T2 is electrically connected to the second electrode PE2 at the collector thereof. However, the second IGBT element T2 may be electrically connected to the second electrode PE2 at the emitter thereof.

In short, the second IGBT element T2 is disposed on the second electrode PE2 and is electrically connected to the second electrode PE2 at one of the emitter and the collector (one terminal) thereof.

In the example shown in FIG. 2, the second connecting wire CL2 is configured to electrically connect the emitter of the second IGBT element T2 to the third electrode PE3 so that the second IGBT element T2 is connected in parallel with the first IGBT element T1. However, the second connecting wire CL2 may be configured to electrically connect the collector of the second IGBT element T2 to the third electrode PE3 so that the second IGBT element T2 is connected in parallel with the first IGBT element T1.

In short, the second connecting wire CL2 is configured to electrically connect the remaining one (the other terminal) of the emitter and the collector of the second IGBT element T2 to the third electrode PE3 so that the second IGBT element T2 is connected in parallel with the first IGBT element T1.

In the example shown in FIG. 2, the first connecting wire CL1 and the second connecting wire CL2 are bonding wires. However, the first connecting wire CL1 and the second connecting wire CL2 may be other types of wires than the bonding wire.

The first gate wire GL1 is electrically connected to the gate of the first IGBT element T1.

The second gate wire GL2 is electrically connected to the gate of the second IGBT element T2.

The third connecting wire CL3 is electrically connected to the first electrode PE1 and the second electrode PE2.

The fourth connecting wire CL4 is electrically connected to the third electrode PE3.

The plurality of first flat plates S1 contain a material that absorbs electromagnetic waves at high frequencies. In the example shown in FIG. 2, two first flat plates S1 are shown.

The material of the first flat plates S1 is ferrite or permalloy, for example.

The first flat plates S1 are fixed to the wiring substrate "LS" but are insulated from the wiring substrate "LS".

The first flat plates S1 are disposed with the upper surfaces thereof being in parallel with the upper surfaces of the insulating substrate 4 and the wiring substrate "LS".

As shown in FIG. 2, one of the plurality of first flat plates S1 is disposed above the first connecting wire CL1. Similarly, another of the plurality of first flat plates S1 is disposed above the second connecting wire CL2.

In short, any one of the first flat plates S1 is disposed above the first connecting wire CL1, and any other one of the first flat plates S1 is disposed above the second connecting wire CL2.

As shown in FIG. 2, the first flat plate S1 disposed above the first connecting wire CL1 is also disposed above the first electrode PE1.

Similarly, the first flat plate S1 disposed above the second connecting wire CL2 is also disposed above the second electrode PE2.

In short, any one of the first flat plates S1 is disposed above the first electrode PE1, and any other one of the first flat plates S1 is disposed above the second electrode PE2.

The wiring substrate "LS" is disposed above the insulating substrate 4 with the first and second electrodes PE1 and PE2 interposed therebetween. The wiring substrate "LS" is electrically connected to the first gate wire GL1 and the second gate wire GL2.

As shown in FIG. 2, the first flat plate S1 disposed above the first connecting wire CL1 and the second flat plate S2 disposed above the second connecting wire CL2 are disposed between the insulating substrate 4 and the wiring substrate "LS".

In short, any one of the first flat plates S1 is disposed between the insulating substrate 4 and the wiring substrate "LS".

As shown in FIG. 3, a first resistor R1, which is a wiring resistance of the wiring substrate "LS", the first gate wire GL1 and the like, exists between the gate of the first IGBT element T1 and the gate terminal "GT". Similarly, as shown in FIG. 3, a second resistor R2, which is a wiring resistance of the wiring substrate "LS", the second gate wire GL2 and the like, exists between the gate of the second IGBT element T2 and the gate terminal "GT".

The plurality of second flat plates S2 contain a material that absorbs electromagnetic waves at high frequencies. In the example shown in FIG. 2, two second flat plates S2 are shown.

The second flat plates S2 are disposed on the wiring substrate "LS".

The material of the second flat plates S2 is ferrite or permalloy, for example.

The second flat plates S2 are fixed to the wiring substrate "LS" but are insulated from the wiring substrate "LS".

The second flat plates S2 are disposed with the upper surfaces thereof being in parallel with the upper surfaces of the insulating substrate 4 and the wiring substrate "LS".

In the example shown in FIG. 2, two first flat plates S1 are disposed above the first IGBT element T1 and the second IGBT element T2, respectively. However, it is enough that at least any one of the first flat plates S1 is disposed above at least any one of the first IGBT element T1 and the second IGBT element T2.

The first diode D1 is connected to the emitter of the first IGBT element T1 at the anode thereof and to the collector of the first IGBT element T1 at the cathode thereof so as to be connected in parallel with the first IGBT element T1 (FIGS. 2 and 3).

In the example shown in FIG. 2, the fifth connecting wire CL5 is configured to electrically connect the emitter of the first IGBT element T1 and the anode of the first diode D1 to each other. However, the fifth connecting wire CL5 may be configured to electrically connect the collector of the first IGBT element T1 and the cathode of the first diode D1 to each other.

In short, the fifth connecting wire CL5 is configured to electrically connect the remaining one of the emitter and the collector of the first IGBT element T1 and the anode or cathode of the first diode D1 to each other.

The second diode D2 is connected to the emitter of the second IGBT element T2 at the anode thereof and to the collector of the second IGBT element T2 at the cathode thereof so as to be connected in parallel with the second IGBT element T2 (FIGS. 2 and 3).

In the example shown in FIG. 2, the sixth connecting wire CL6 is configured to electrically connect the emitter of the second IGBT element T2 and the anode of the second diode D2 to each other. However, the sixth connecting wire CL6 may be configured to electrically connect the collector of the second IGBT element T2 and the cathode of the second diode D2 to each other.

In short, the sixth connecting wire CL6 is configured to electrically connect the remaining one of the emitter and the collector of the second IGBT element T2 and the anode or cathode of the second diode D2 to each other.

In the example shown in FIG. 2, the first flat plate S1 disposed above the first connecting wire CL1 is also disposed above the fifth connecting wire CL5.

Similarly, in the example shown in FIG. 2, the first flat plate S1 disposed above the second connecting wire CL2 is also disposed above the sixth connecting wire CL6.

In short, any one of the first flat plates S1 is disposed above the fifth connecting wire CL5, and any other one of the first flat plates S1 is disposed above the sixth connecting wire CL6.

In the example shown in FIG. 2, the first flat plate S1 disposed above the fifth connecting wire CL5 is disposed adjacent to the third connecting wire CL3 and the fourth connecting wire CL4.

Similarly, in the example shown in FIG. 2, the first flat plate S1 disposed above the sixth connecting wire CL6 is disposed adjacent to the third connecting wire CL3 and the fourth connecting wire CL4.

In short, any of the first flat plates S1 is disposed adjacent to the third connecting wire CL3 and the fourth connecting wire CL4.

In the example shown in FIG. 2, the fifth connecting wire CL5 and the sixth connecting wire CL6 are bonding wires. However, the fifth connecting wire CL5 and the sixth connecting wire CL6 may be other types of wires than the bonding wire.

As described above, in the semiconductor device 100, flat plates are disposed adjacent to the IGBT elements connected in parallel with each other, the wires and the wiring substrate.

As a result, the flat plates absorb electromagnetic waves at high frequencies that are emitted by the two IGBT elements, the wires and the wiring substrate and cause a resonance. In other words, the electromagnetic interference ("EMI") noise caused by a resonance can be absorbed by the flat plates and converted into heat. The heat generated by the flat plates is on the order of several µJ, and therefore the influence of the heat on the characteristics of the semiconductor device 100 is ignorable.

Accordingly, current and voltage fluctuations that occur in the IGBT elements when the IGBT elements are turned off can be reduced without increasing the parasitic inductance component of the wires or modifying the wiring itself.

Furthermore, the semiconductor device 100 does not include any additional ferrite core, which is inserted in the wiring path according to prior art. Therefore, the length of the wiring of the semiconductor device 100 can be reduced.

Furthermore, as described above, in the semiconductor device 100, the flat plates are disposed between the wiring substrate and the IGBT elements. Therefore, the flat plates absorb EMI noise caused by electromagnetic waves at high frequencies generated by the IGBT elements and the wires, and therefore the influence of the EMI noise on the wiring substrate can be reduced.

Furthermore, if the flat plates are made of ferrite, for example, the loss effect at high frequencies can be increased, and current and voltage fluctuations can be effectively reduced. In particular, at frequencies equal to or lower than 1 MHz, ferrite has low impedance, so that the influence of a turn-on or turn-off on the switching characteristics of the IGBT elements can be reduced.

As described above, the semiconductor device according to this embodiment can reduce the EMI noise while having a reduced length of wiring.

The first to third electrodes can also have the shape of a sphere, a cube or a rod.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor device, comprising:
an insulating substrate;
a first electrode disposed on the insulating substrate;
a second electrode disposed on the insulating substrate;
a third electrode disposed on the insulating substrate;
a first switch element disposed on the first electrode and electrically connected to the first electrode at a first terminal of the first switch element;
a first connecting wire that electrically connects a second terminal of the first switch element to the third electrode;

a second switch element disposed on the second electrode and electrically connected to the second electrode at a first terminal of the second switch element;
a second connecting wire that electrically connects a second terminal of the second switch element to the third electrode so that the second switch element is connected in parallel with the first switch element;
a first gate wire electrically connected to a gate of the first switch element;
a second gate wire electrically connected to a gate of the second switch element;
a third connecting wire electrically connected to the first electrode and the second electrode;
a fourth connecting wire electrically connected to the third electrode;
a pair of first flat plates each containing a material that absorbs electromagnetic waves;
a wiring substrate disposed above the insulating substrate, wherein the first electrode and the second electrode are interposed between the wiring substrate and the insulating substrate, the wiring substrate being electrically connected to the first gate wire and the second gate wire; and
a pair of second flat plates each containing the material that absorbs electromagnetic waves;
wherein one of the first flat plates is disposed above the first connecting wire, and the other one of the first flat plates is disposed above the second connecting wire;
wherein the one of the first flat plates is disposed above the first electrode, and the other one of the first flat plates is disposed above the second electrode;
wherein the one or the other one of the first flat plates is disposed between the insulating substrate and the wiring substrate;
wherein the pair of second plates are disposed on the wiring substrate;
wherein the one of the first flat plates is disposed above the first switch element, and the other one of the first flat plates is disposed above the second switch element; and
wherein the one or the other one of the first flat plates is disposed adjacent to the third connecting wire and the fourth connecting wire.

2. The semiconductor device according to claim 1, wherein the first connecting wire and the second connecting wire are bonding wires.

3. The semiconductor device according to claim 1, wherein the material contained in the first flat plates and the second flat plates is ferrite or permalloy.

4. The semiconductor device according to claim 1, wherein the first switch element is a first insulated gate bipolar transistor (IGBT) element disposed on the first electrode and electrically connected to the first electrode at one of an emitter and a collector of the first IGBT element and to the third electrode via the first connecting wire at the other one of the emitter and the collector of the first IGBT element, and the second switch element is a second IGBT element disposed on the second electrode and electrically connected to the second electrode at one of an emitter and a collector of the second IGBT element and to the third electrode via the second connecting wire at the other one of the emitter and the collector of the second IGBT element so as to be connected in parallel with the first switch element.

5. The semiconductor device according to claim 4, further comprising:
a first diode that is connected to the emitter of the first IGBT element at an anode of the first diode and to the collector of the first IGBT element at a cathode of the first diode so as to be connected in parallel with the first IGBT element; and
a second diode that is connected to the emitter of the second IGBT element at an anode of the second diode and to the collector of the second IGBT element at a cathode of the second diode so as to be connected in parallel with the second IGBT element.

6. The semiconductor device according to claim 5, further comprising:
a fifth connecting wire that is configured to electrically connect the other one of the emitter and the collector of the first IGBT element and the anode or the cathode of the first diode to each other; and
a sixth connecting wire that is configured to electrically connect the other one of the emitter and the collector of the second IGBT element and the anode or the cathode of the second diode to each other,
wherein the one of the first flat plates is disposed above the fifth connecting wire, and the other one of the first flat plates is disposed above the sixth connecting wire.

7. The semiconductor device according to claim 6, wherein the fifth connecting wire and the sixth connecting wire are bonding wires.

8. The semiconductor device according to claim 1, further comprising:
a heat radiating plate; and
a resin seal that seals, on the heat radiating plate, at least the insulating substrate, the first electrode, the second electrode, the third electrode, the first switch element, the second switch element, the first gate wire, the second gate wire, the first connecting wire, the second connecting wire, the third connecting wire, the fourth connecting wire and the first flat plates.

9. The semiconductor device according to claim 8, further comprising:
a first external terminal that is disposed to be exposed from the resin seal, and is electrically connected to the first gate wire and the second gate wire via the wiring substrate;
a second external terminal that is disposed to be exposed from the resin seal, and is electrically connected to the third connecting wire; and
a third external terminal that is disposed to be exposed from the resin seal, and is electrically connected to the fourth connecting wire.

10. The semiconductor device according to claim 9, further comprising a housing that is made of a resin material and disposed on the heat radiating plate so as to surround the resin seal.

11. The semiconductor device according to claim 10, wherein the first external terminal, the second external terminal and the third external terminal are disposed outside of the housing.

* * * * *